US012793785B2

(12) United States Patent
Deng et al.

(10) Patent No.: US 12,793,785 B2
(45) Date of Patent: Nov. 10, 2026

(54) METHODS OF OPERATING A MEMORY, MEMORY AND MEMORY SYSTEMS

(71) Applicant: Yangtze Memory Technologies Co., Ltd., Wuhan (CN)

(72) Inventors: JiaLiang Deng, Wuhan (CN); Bo Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 191 days.

(21) Appl. No.: 18/241,191

(22) Filed: Aug. 31, 2023

(65) Prior Publication Data

US 2025/0006273 A1 Jan. 2, 2025

(30) Foreign Application Priority Data

Jun. 30, 2023 (CN) ......................... 202310802617.4

(51) Int. Cl.
*G11C 16/12* (2006.01)

(52) U.S. Cl.
CPC .................................... *G11C 16/12* (2013.01)

(58) Field of Classification Search
CPC ...................................................... G11C 16/12
USPC ..................................................... 365/185.19
See application file for complete search history.

(56) References Cited

U.S. PATENT DOCUMENTS 11,386,969 B1 7/2022 Banerjee et al.
2011/0194346 A1* 8/2011 Yoon .................. G11C 16/3459 365/185.03
2016/0055919 A1* 2/2016 Park ................... G11C 16/0483 365/185.12
2018/0075909 A1 3/2018 Lee
2022/0375513 A1* 11/2022 Singidi ............... G11C 11/5628
(Continued)

FOREIGN PATENT DOCUMENTS

| | | |
|---|---|---|
| CN | 112965667 | 6/2021 |
| CN | 113892141 A | 1/2022 |

OTHER PUBLICATIONS

China National Intellectual Property Administration, "The First Office Action and Search Report," issued in connection with Chinese Patent Application No. 202310802617.4, dated Aug. 28. 2025, 17 pages. [English translation included].

*Primary Examiner* — Alexander Sofocleous
*Assistant Examiner* — Duy H Luong
(74) *Attorney, Agent, or Firm* — Hanley, Flight & Zimmerman, LLC

(57) ABSTRACT

The present disclosure provides a method of operating a memory, a memory and a memory system. The method comprises: performing a plurality of first programming verification operations on a plurality of memory cells of the memory, to acquire a plurality of memory cells with a first programming state to an i-th programming state, wherein i is a positive integer; performing a second programming verification operation on the memory cells with a an n-th programming state, to acquire a second verification result for the memory cells with the n-th programming state, wherein n is a positive integer; if the second verification result for the memory cells with the n-th programming state is greater than or equal to a second preset value, performing the second programming verification operation on the memory cells with n+1 programming state, wherein the second preset value is different from the first preset value.

17 Claims, 5 Drawing Sheets

(56) References Cited

U.S. PATENT DOCUMENTS

| | | | | |
|---|---|---|---|---|
| 2023/0088147 | A1* | 3/2023 | Choi | G11C 7/1084<br>365/185.22 |
| 2023/0148366 | A1 | 5/2023 | Guo | |
| 2024/0006004 | A1* | 1/2024 | Li | G11C 16/08 |
| 2024/0304249 | A1* | 9/2024 | Choi | G11C 16/10 |

* cited by examiner

METHODS OF OPERATING A MEMORY, MEMORY AND MEMORY SYSTEMS

CROSS REFERENCE TO RELATED APPLICATIONS

This application claims priority to and the benefit of Chinese Patent Application 202310802617 4.4, filed on Jun. 30, 2023, which is hereby incorporated by reference in its entirety.

TECHNICAL FIELD

The present disclosure relates to the technical field of memory, in particular to a method of operating a memory, a memory and a memory system.

BACKGROUND

NAND flash memory is a kind of non-volatile memory technology, that is, NAND flash memory may still main data after power-off, and it has the advantages of low cost and high storage capacity. The existing NAND flash memory chips usually adopt the method of incremental step pulse programming (ISPP) for programming, to program memory cells with gradually increasing programming voltage. The corresponding verification pulse after each programming pulse is used to verify whether a threshold voltage of a memory cell reaches a target value.

BRIEF DESCRIPTION OF THE DRAWINGS

In order to more clearly illustrate the technical aspects of the present disclosure, a brief description of the drawings required in some examples of the present disclosure will be given below. Obviously, the drawings described below are only drawings of some examples of the present disclosure, and other drawings may be obtained based on these drawings by those of ordinary skill in the art. In addition, the drawings in the following description may be regarded as schematic diagrams and not as limiting the actual size of the product, the actual flow of method and the actual timing of signals according to the example of the present disclosure.

DETAILED DESCRIPTION

Figure 1:
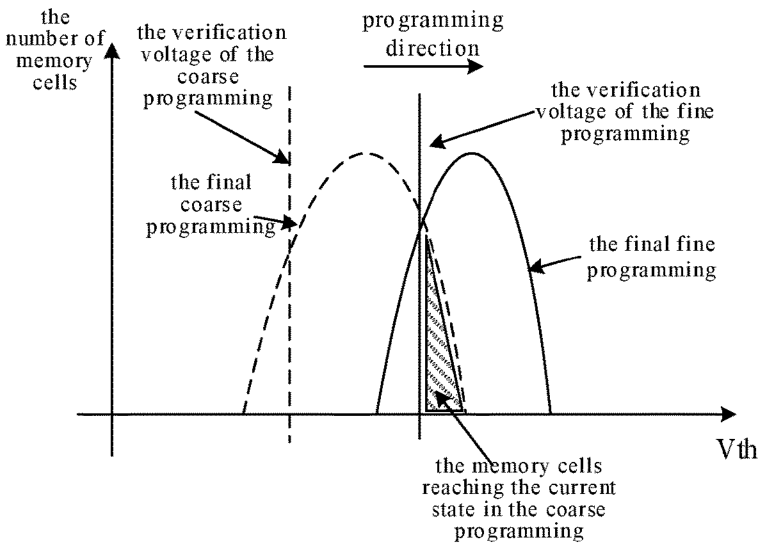
FIG. 1 is a threshold voltage distribution diagram of a current programming state provided by an example of the present disclosure.

The technical aspects of some examples of the present disclosure will be clearly and fully described below in conjunction with the accompanying drawings. It will be apparent that the described examples are only part of and not all of the examples of the present disclosure. All other examples conceived by those of ordinary skill in the art based on the examples provided in the present disclosure fall within the scope of protection of the present disclosure.

It should be understood in the description of the present disclosure that the terms "center", "up", "down", "front", "back", "left", "right", "vertical", "horizontal", "top", "bottom", "inside", and "outside" indicate orientations or positional relationships that are based on the drawings are only for convenience of description and simplification of the description and are not intended to indicate or imply that the device or element must have a particular orientation or must be constructed and operated in a particular orientation, therefore may not be construed as limiting to the present disclosure.

Throughout the specification and the claims, the term "include" is construed to mean "include but not limited to" unless the context requires otherwise. In the description of the specification, the terms "an example", "some examples", or "some examples" and the like are intended to indicate that particular feature, structure, materials or characteristics related to the example or examples are included in at least one example or example of the present disclosure. The schematic representations of the above terms do not necessarily refer to the same example or examples. Further, the particular feature, structure, materials or characteristics may be included in any one or more examples or examples as appropriate.

In the following, terms such as "first" and "second" are used for descriptive purposes only and may not be understood as indicating or implying relative importance or implying the quantity of technical features indicated. Thus, features defined with "first" and "second" may explicitly or implicitly include one or more such features. In the description of examples of the present disclosure, "a plurality of" means two or more unless otherwise stated. "At least one of A, B and C" and "at least one of A. B or C" have the same meaning and include combinations of A, B and C: only A, only B, only C, and combination of And B, combination of And C, combination of B and C, and combinations of A, B and C. "And/or B" includes the following three combinations: only A, only B, and combination of And B.

The phrases such as "suitable for" or "configured to" used herein implies an open and inclusive language that does not exclude devices suitable for or configured to perform additional tasks.

Additionally, the use of "based on" means open and inclusive because the process, calculation and other actions "based on" one or more of conditions or values may in practice be based on additional conditions or exceed said values.

As used herein, terms such as "about", "substantially" or "approximately" includes the values set forth and an average value within an acceptable deviation range of a particular value, where the acceptable deviation range is determined by a person of ordinary skill in the art when taking into account the measurements in question and the errors associated with the measurements of a particular quantity (i.e., limitations of the measurement system).

In this disclosure, the meanings of "on", "above" and "over" should be interpreted in the broadest sense such that "on" not only means "directly on something" but also means of "on something" with intermediate features or layers therebetween, and "above" or "over" not only means "above" or "over" something but also means "above" or "over" something without intermediate features or layers therebetween (i.e., directly on something).

The examples are described herein with reference to cross-sectional views and/or plan views of example drawings. The thicknesses of the layers and regions are enlarged for clarity in the drawings. Variations in shape relative to the drawings due to, for example, manufacturing techniques and/or tolerances are therefore envisaged. Thus, the examples should not be interpreted as being limited to the shape of the regions shown herein, but as including shape deviations due to, for example, manufacture. For example, the etched areas shown as rectangles will generally have curved features. Thus, the areas shown in the drawings are schematic in nature and their shapes are not intended to show the actual shape of the area of the device and are not intended to limit the scope of the examples.

The term "substrate" as used herein refers to a material to which subsequent layers of material may be added. The substrate itself may be patterned. The material added to the substrate may or may not be patterned. In addition, the substrate may include a variety of semiconductor materials such as silicon, germanium, gallium arsenide, indium phosphide and the like. Alternatively, the substrate may be made of a non-conductive material such as a glass, plastic or a sapphire wafer.

The term "three-dimensional memory" refers to a semiconductor device formed by strings of memory cell transistors (referred to herein as "memory cell strings", such as NAND memory cell strings) arrayed on a main surface of a substrate or source layer and extending in a direction perpendicular to the substrate or source layer. The term "perpendicular/perpendicularly" as used herein means that it is nominally perpendicular to a main surface (i.e., a transverse surface) of the substrate or source layer.

The time required for programming is increasing with the increased number of bits stored in the memory cells. The number of applying programming pulse and that of performing programming verification operation are the important factors to determine the programming time. Therefore, how to shorten the programming time under the premise of ensuring programming quality has become an urgent problem to be solved.

In the development of NAND memory, the early memory cells of NAND memory particles are mostly single level cell (SLC), i.e., one memory cell stores 1 bit data. At this time, each memory cell has two states, 0 and 1.

With the development of NAND memory, the memory cells of NAND memory particles gradually evolve from SLC to multi-level cell (MLC), that is, one memory cell stores 2 bits of data. Then, a triple level cell (TLC) is introduced, that is, one memory cell stores 3 bits of data. There is even a quad level cell (QLC), that is, one memory cell stores 4 bits of data. Accordingly, the states of NAND memory particles memory cells is also changed from 2 to 4, 8 or even 16.

NAND memory cells may have $2^n$ states, wherein n is the number of bits which may be stored in a memory cell. For example, an SLC memory cell may have 2 states, an MLC memory cell may have 4 states, a TLC memory cell may have 8 states, and a QLC memory cell may have 16 states. The $2^n$ states may include an erased state and $2^n$-1 programmed states. The NAND memory may program and/or read data on a page-by-page basis in a unit of a page. During a programming operation, the NAND memory cell is programmed to have $2^n$ states, and n bits of data as one of these states are written into the NAND memory cell. For the programming operation of NAND memory, for example, it is divided into three phases: pressurized program (i.e., by applying a programming pulse), programing verify (PV) and scanning verification result.

For NAND memory, programming time ($t_{PROG}$) is a key indicator to measure the performance of NAND memory. Therefore, how to improve the programming speed and shorten the programming time under the premise of ensuring programming quality (for example, ensuring read budget window) is an urgent problem to be solved. Because the duration of applied programming pulses may not be changed, the number of applied programming pulses, the number of programming verifications and the time of performing every programming verification and the time of scanning verification results are all important factors to determine the programming time. Taking QLC memory cell as an example, the time of performing programming verifications for 15 states accounts for more than half of the programming time, so that it is important to reduce the time of performing programming verifications of each state to improve the programming time.

Therefore, a method of programming verification is proposed. Each of programming verification states includes a corresponding start time. Taking TLC memory cell as an example, TLC memory cell has one erase state and seven programming states, the first state to the seventh state of which are denoted as L1, L2, L3, L4, L5, L6 and L7 in sequence, as shown in Table 1. Table 1 shows the programming verification operation and start time of different programming states. PV1 represents a programming verification operation on the first state (L1) and PV2 represents a programming verification operation on the second state (L2), and so on.

TABLE 1

| program verify (PV) | start time |
|---|---|
| PV1 | 1 |
| PV2 | 3 |
| PV3 | 4 |
| PV4 | 5 |
| PV5 | 7 |
| PV6 | 9 |
| PV7 | 11 |

The start time of the programming verification operation may be defined by the number of programming pulses after which the programming verification operation is applied. For example, the start time of the programming verification operation of the first state is 1, which means that the programming verification is performed on the first state after the first programming pulse is applied and before the second programming pulse is applied.

Compared with the solution that programming verification is performed on each state after applying programming pulse each time, the above programming verification method reduces the number of programming verification to a certain extent, but there will be differences in programming characteristics when different units are programming at the same time. For each state, there are still errors when all dies, block or word lines (WL) are set with the same start time. Further, the way that the start time of verification on each state is determined by the program pulse loop count may not adapt to the programming speed of memory cells in different program/erase cycles. The end of life (EOL) is faster than the begin of life (BOL), thus, in order to avoid over-programming, the time of performing programming verifications will be set earlier to ensure the normal programming of EOL.

In order to shorten the programming time, a dynamic program verify start (DPVS) algorithm is proposed. In this algorithm, it is determined whether to verify the next programming state according to the number of pass cells in the current state. The time overhead of verification may be reduced by adapting the programming speed of a memory cell.

Taking QLC NAND flash memory as an example, it is common to adopt the two passes programming scheme of 16-16 to reduce the coupling effect between adjacent word lines (WL). The two passes programming scheme includes coarse programming and fine programming. In addition, during the programming, the coarse programming is performed firstly and then fine programming is performed, both of them adapt DPVS algorithm. The number of the verification of coarse programming are shown in Table 2, and the number of verifications of fine programming are shown in Table 3.

TABLE 2

| number | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| p1 | ✓ | ✓ | ✓ | ✓ | ✓ | ✓ | ✓ | | | | | | | | | | | | | | | | | | |
| p2 | ✓ | ✓ | ✓ | ✓ | ✓ | ✓ | ✓ | ✓ | | | | | | | | | | | | | | | | | |
| p3 | | | | | ✓ | ✓ | ✓ | ✓ | ✓ | | | | | | | | | | | | | | | | |
| p4 | | | | | | ✓ | ✓ | ✓ | ✓ | ✓ | | | | | | | | | | | | | | | |
| p5 | | | | | | | | ✓ | ✓ | ✓ | ✓ | | | | | | | | | | | | | | |
| p6 | | | | | | | | | ✓ | ✓ | ✓ | ✓ | | | | | | | | | | | | | |
| p7 | | | | | | | | | | ✓ | ✓ | ✓ | ✓ | | | | | | | | | | | | |
| p8 | | | | | | | | | | | ✓ | ✓ | ✓ | ✓ | | | | | | | | | | | |
| p9 | | | | | | | | | | | | | ✓ | ✓ | ✓ | ✓ | | | | | | | | | |
| p10 | | | | | | | | | | | | | | ✓ | ✓ | ✓ | ✓ | | | | | | | | |
| p11 | | | | | | | | | | | | | | | ✓ | ✓ | ✓ | ✓ | | | | | | | |
| p12 | | | | | | | | | | | | | | | ✓ | ✓ | ✓ | ✓ | ✓ | | | | | | |
| p13 | | | | | | | | | | | | | | | | | ✓ | ✓ | ✓ | ✓ | ✓ | | | | |
| p14 | | | | | | | | | | | | | | | | | | ✓ | ✓ | ✓ | ✓ | ✓ | | | |
| p15 | | | | | | | | | | | | | | | | | | | | ✓ | ✓ | ✓ | ✓ | ✓ | |

TABLE 3

| number | 1 | 2 | 3 | 4 | 5 | 6 | 7 | 8 | 9 | 9 | 10 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| p1 | ✓ | ✓ | ✓ | ✓ | ✓ | ✓ | ✓ | ✓ | | | | | | | | | | | | | | | | | |
| p2 | ✓ | ✓ | ✓ | ✓ | ✓ | ✓ | ✓ | ✓ | ✓ | ✓ | ✓ | | | | | | | | | | | | | | |
| p3 | | | ✓ | ✓ | ✓ | ✓ | ✓ | ✓ | ✓ | ✓ | ✓ | ✓ | ✓ | | | | | | | | | | | | |
| p4 | | | | | | | ✓ | ✓ | ✓ | ✓ | ✓ | ✓ | ✓ | ✓ | ✓ | | | | | | | | | | |
| p5 | | | | | | | | ✓ | ✓ | ✓ | ✓ | ✓ | ✓ | ✓ | ✓ | ✓ | ✓ | | | | | | | | |
| p6 | | | | | | | | | ✓ | ✓ | ✓ | ✓ | ✓ | ✓ | ✓ | ✓ | ✓ | ✓ | ✓ | | | | | | |
| p7 | | | | | | | | | | | | | ✓ | ✓ | ✓ | ✓ | ✓ | ✓ | ✓ | ✓ | ✓ | ✓ | | | |
| p8 | | | | | | | | | | | | | | ✓ | ✓ | ✓ | ✓ | ✓ | ✓ | ✓ | ✓ | ✓ | ✓ | ✓ | |
| p9 | | | | | | | | | | | | | | | | ✓ | ✓ | ✓ | ✓ | ✓ | ✓ | ✓ | ✓ | ✓ | ✓ |
| p10 | | | | | | | | | | | | | | | | | ✓ | ✓ | ✓ | ✓ | ✓ | ✓ | ✓ | ✓ | ✓ |
| p11 | | | | | | | | | | | | | | | | | | ✓ | ✓ | ✓ | ✓ | ✓ | ✓ | ✓ | ✓ |
| p12 | | | | | | | | | | | | | | | | | | | | | | | ✓ | ✓ | ✓ |
| p13 | | | | | | | | | | | | | | | | | | | | | | | | | ✓ |
| p14 | | | | | | | | | | | | | | | | | | | | | | | | | |
| p15 | | | | | | | | | | | | | | | | | | | | | | | | | |

| number | 26 | 27 | 28 | 29 | 30 | 31 | 32 | 33 | 34 | 35 | 36 | 37 | 38 | 39 | 40 | 41 | 42 |
|---|---|---|---|---|---|---|---|---|---|---|---|---|---|---|---|---|---|
| p1 | | | | | | | | | | | | | | | | | |
| p2 | | | | | | | | | | | | | | | | | |
| p3 | | | | | | | | | | | | | | | | | |
| p4 | | | | | | | | | | | | | | | | | |
| p5 | | | | | | | | | | | | | | | | | |
| p6 | | | | | | | | | | | | | | | | | |
| p7 | | | | | | | | | | | | | | | | | |
| p8 | | | | | | | | | | | | | | | | | |
| p9 | ✓ | | | | | | | | | | | | | | | | |
| p10 | ✓ | ✓ | ✓ | | | | | | | | | | | | | | |
| p11 | ✓ | ✓ | ✓ | ✓ | ✓ | | | | | | | | | | | | |
| p12 | ✓ | ✓ | ✓ | ✓ | ✓ | ✓ | ✓ | ✓ | ✓ | | | | | | | | |
| p13 | ✓ | ✓ | ✓ | ✓ | ✓ | ✓ | ✓ | ✓ | ✓ | ✓ | ✓ | ✓ | | | | | |
| p14 | ✓ | ✓ | ✓ | ✓ | ✓ | ✓ | ✓ | ✓ | ✓ | ✓ | ✓ | ✓ | ✓ | ✓ | ✓ | | |
| p15 | | | | | | ✓ | ✓ | ✓ | ✓ | ✓ | ✓ | ✓ | ✓ | ✓ | ✓ | ✓ | |

It may be seen from Tables 2 and 3 that the number of verifications of the fine programming is more than that of coarse programming when both adapting DPVS algorithm. After the coarse programming is completed and before the fine programming is started, the memory cells have been substantially distributed in their respective threshold value intervals. If it is still determined whether to perform verification of next programming state according to the number of pass cells in the current state, the fine programming will be affected by the coarse programming and the number of verifications of the fine programming will be increased.

As shown in FIG. 1, which is a threshold voltage distribution diagram of a current programming state according to an implementation of the present disclosure. FIG. 1 shows the threshold voltage distribution diagrams of the final coarse programming and the final fine programming in the current state. It may be seen from FIG. 1 that after the completion of the coarse programming in the current state and before the start of the fine programming in the current state, the number of memory cells obtained based on the verification voltage of the fine programming includes the number of memory cells reaching the current state in the coarse programming. If it is determined whether to perform the verification operation of the next programming state in the fine programming based on the number of the memory cells, the number of verifications in the fine programming will be increased.

Therefore, a method of operating a memory is provided according to examples of the present disclosure, the method adopts two-step programming, i.e., coarse programming and fine programming. In coarse programming, it is determined whether to perform a first programming verification operation of a next programming state based on a first preset value. In fine programming, it is determined whether to perform a second programming verification operation of a next programming state based on a second preset value. Comparing with the solution that the coarse programming and fine programming both adopt the same preset value, the method of operating a memory according to examples of this disclosure uses different preset values in coarse programming and fine programming respectively, thus the effect on fine programming caused by the coarse programming is reduced, the number of verifications of fine programming is reduced, and the programming time is shortened.

In order to facilitate understanding, a memory system in which the method of operating a memory provided by the examples of the present disclosure is applied will be described first.

Figure 2:
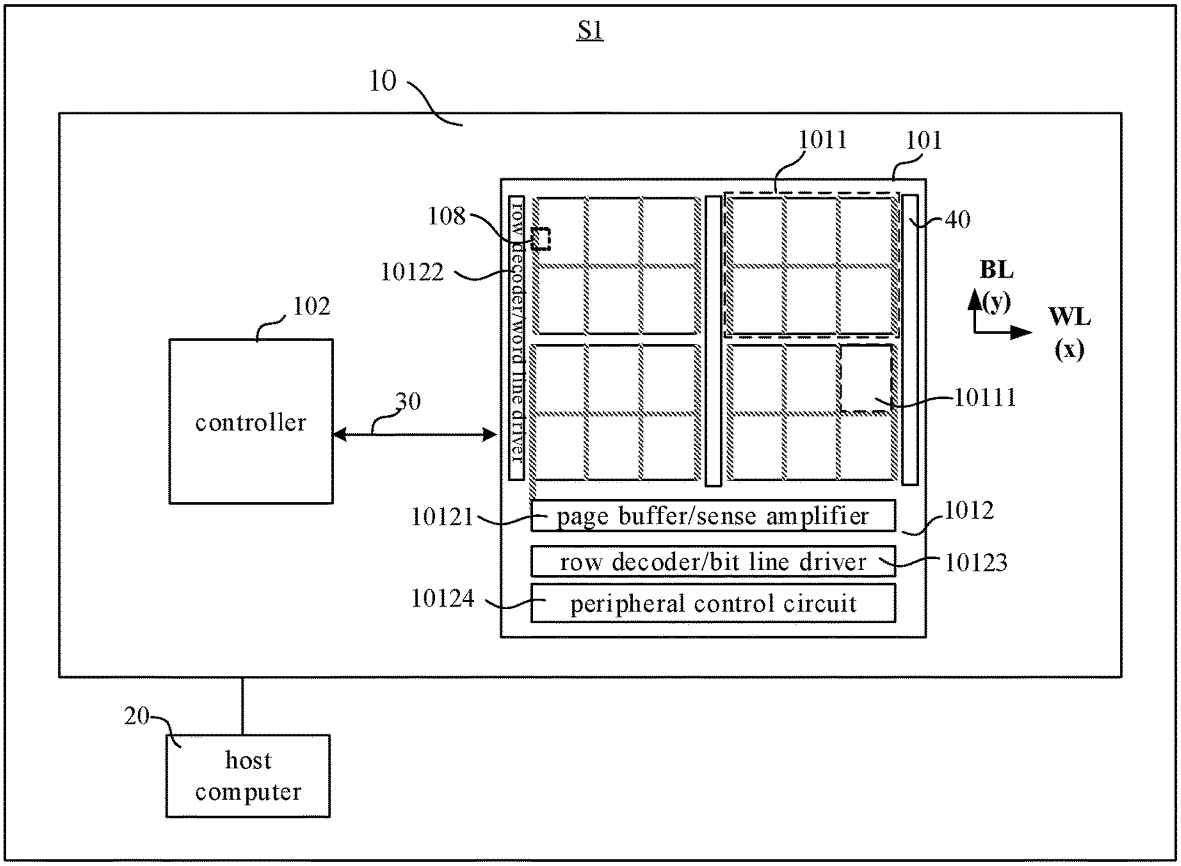
FIG. 2 is a schematic diagram of structure of an example system S1 having a memory system 10 provided by an example of the present disclosure.

As shown in FIG. 2, which is a schematic diagram of structure of an example system S1 having a memory system 10 provided by an implementation of the present disclosure. The system S1 may be a mobile phone, desktop computer, laptop, tablet, vehicle computer, game console, printer, positioning device, wearable electronic device, smart sensor, virtual reality (VR) device, augmented reality (AR) device, or any other electronic device having a storage device therein, or the like. The memory system 10 (also referred to as a NAND memory system) includes a memory 101 and a controller 102. The memory system 10 may communicate with the host computer 20 through a controller 102 which may be coupled to the memory 101 via memory channel 30. In some examples, the memory 101 in the present disclosure may include a three-dimensional non-volatile memory, such as a NAND flash memory (or simply referred to a flash or a NAND memory). Of course, the memory 101 in the present disclosure may also include other memories. The memory system 10 may have more than one memory 101, and each of memories 101 may be managed by the controller 102.

In some examples, the host computer 20 may be a processor of an electronic device, such as a central processing unit (CPU), system-on-chip (SoC) or an application processor (AP). The host computer 20 may send data to be stored at the memory system 10 or read data stored at the memory system 10.

The controller 102 may process input/output (I/O) requests received from the host computer 20 to ensure data integrity and efficient storage and may also manage the memory 101. The memory channel 30 may provide data via data bus and control communication between controller 102 and memory 101.

Still referring to FIG. 2, the memory 101 may be a memory chip (package), memory die or any portion of a memory die, and may include one or more memory planes 1011, each of which may include a plurality of memory blocks 10111. The same and concurrent operations may occur at each memory plane 1011. The size of the memory block 10111 may be megabytes (MB). The memory block 10111 is the smallest unit on which an erase operation is performed. The memory 101 illustrated in FIG. 1 includes four memory planes 1011, and each of memory planes 1011 includes six memory blocks 10111. Each of memory blocks 10111 may include a plurality of memory cells which may be addressed by, for example, a bit line (BL) and a word line (WL). The bit lines and word lines may be arranged vertically (e.g. in rows and columns, respectively) to form an array of metal lines. The directions of the bit lines and word lines are labeled as "BL" and "WL" respectively in FIG. 1. One or more memory blocks 10111 may also be referred to as "memory arrays" or "arrays" in the present disclosure. The memory array is the core area of a memory device that performs storage functions.

The memory 101 also includes a peripheral circuit region 1012, that is, the peripheral area of the memory plane 1011. The peripheral circuit region 1012 (also referred to as peripheral circuit) contains many digital, analog, and/or mixed signal circuits (e.g., page buffer/sense amplifier 10121, row decoder/word line driver 10122, column decoder/bit line driver 10123, and peripheral control circuitry 10124) to support the functions of memory 101. The peripheral control circuit 10124 may include registers, active and/or passive semiconductor devices, such as transistors, diodes, capacitors or resistors, and the like. The peripheral control circuit 10124 of the peripheral circuit region 1012 may be configured to initiate a programming operation on selected memory cells of the NAND strings in the memory block 10111. In some examples, the peripheral control circuit 10124 receives programming commands from the controller 102 via an interface and, in response, sends control signals to the row decoder/word line driver 10122, column decoders/bit line driver 10123, and voltage generator (not shown in FIG. 2) disposed in the peripheral circuit region 1012 to initiate a programming operation on selected memory cells.

Note that the layout of electronic devices in the memory system 10 and memory 101 in FIG. 2 is shown as an example. The memory system 10 and memory 101 may have other layouts and may include additional devices. For example, the memory 101 may also include a high-voltage charge pump, input and output circuits, and the like. The memory system 10 may also include firmware, a data scrambler, and the like. In some examples, the peripheral circuit region 1012 and the memory array may be independently formed on a separate wafer and connected to each other by wafer bonding.

Figure 3:
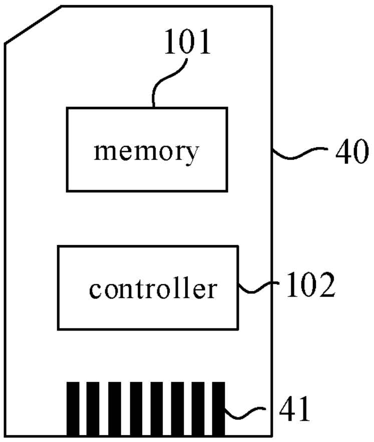
FIG. 3 is a schematic diagram of a memory card provided by an example of the present disclosure.
Figure 4:
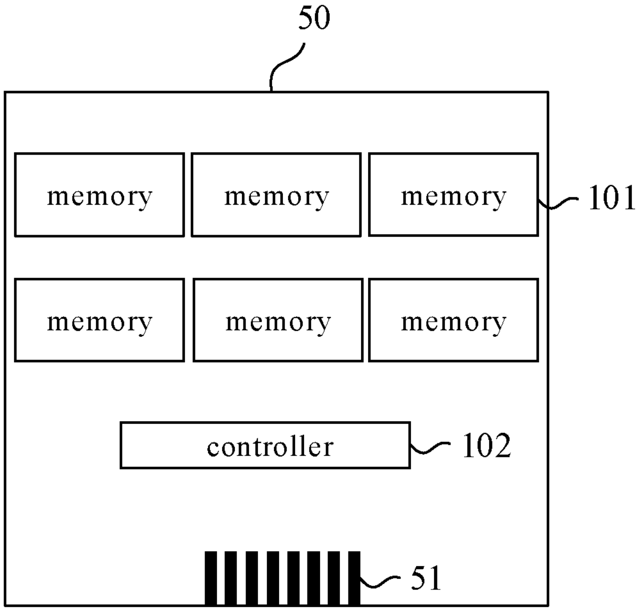
FIG. 4 is a schematic diagram of another memory card provided by an example of the present disclosure.

The controller 102 and one or more memories 101 may be integrated into various types of storage devices, for example, in the same package, such as a universal flash storage (UFS) package or an embedded multimedia card (eMMC) package. That is, the memory system 10 may be implemented and packaged into different types of end electronic products. In one example as shown in FIG. 3, the controller 102 and a single memory 101 may be integrated into a memory card 40. The memory card 40 may include personal computer memory card international association (PCMCIA), compact flash (CF) card, smart media (SM) card, memory stick, multimedia card (MMC), secure digital memory card (SD card) or UFS, etc. Memory card 40 may also include a memory card connector 41 which couples memory card 40 with host computer 20. In another example as shown in FIG. 4, the controller 102 and a plurality of memories 101 may be integrated into a solid state driver (SSD) 50. The SSD 50 may also include an SSD connector S1 coupling the SSD 50 with the host computer 20.

Figure 5:
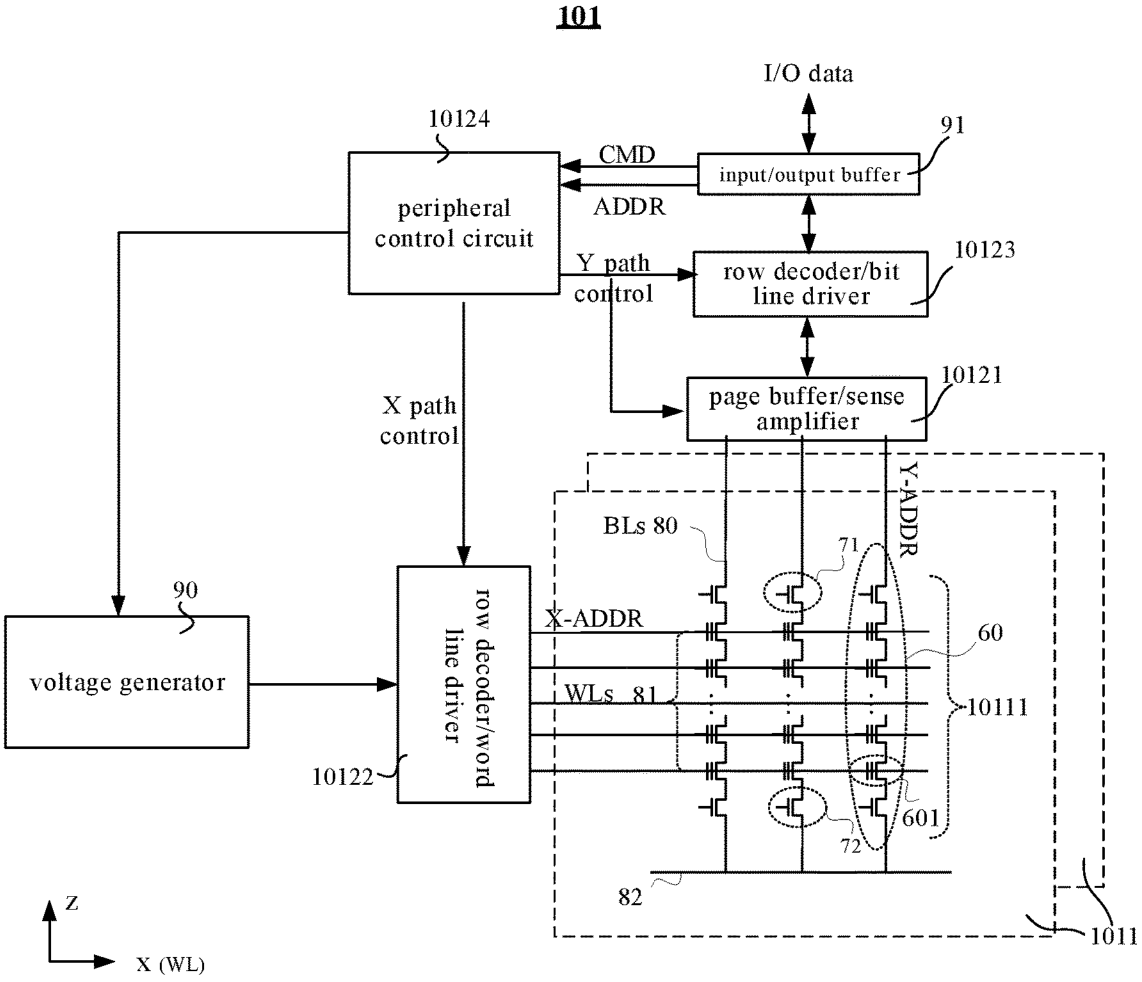
FIG. 5 is a schematic diagram of structure of a memory provided by an example of the present disclosure.

As shown in FIG. 5, which is a schematic diagram of structure of a memory 101 provided according to an implementation of the present disclosure. The memory 101 includes one or more memory blocks 10111. Each of memory blocks 10111 includes memory strings 60. Each of memory strings 60 includes memory cells 601. The memory cells 601 sharing the same bit line form memory strings 60. The memory string 60 may also include, at each end, at least one field-effect transistor (e.g., metal-oxide-semiconductor field-effect transistor (MOSFET) controlled by a top select gate (TSG) 71 and a bottom select gate (BSG) 72 respectively. The drain terminal of the TSG 71 may be connected to a bit line 80 and the source terminal of the BSG 72 may be connected to an array common source (ACS) 82. The ACS 82 may be shared by the memory strings 60 in the entire memory block 10111, and is also referred to as a common source line (SL).

In some examples, the peripheral circuit region 1012 of the memory 101 may support an erase operation of the GIDL assist technique. The memory block 10111 may be coupled to the row decoder/word line driver 10122 via the word line 81, GSG 72 and TSG 71. The memory block 10111 may be coupled to page buffer/sense amplifier 10121 via bit line 80. The row decoder/word line driver 10122 may select one of the memory blocks 10111 in the memory 101 in response to X-path control signal provided by the peripheral control circuit 10124. The row decoder/word line driver 10122 may transfer the voltage supplied from the voltage generator 90 to the word line 81 according to X-path control signal. During read and program operation, the row decoder/word line driver 10122 may transfer the read voltage Vread and the program voltage Vpgm to the selected word line 81 and transfer the pass voltage Vpass to the non-selected word line 81 according to the X-path control signal received from the peripheral control circuit 10124.

The column decoder/bit line driver 10123 may transfer the inhibit voltage Vinhibit to the non-selected word line in accordance with Y-path control signal received from the peripheral control circuit 10124, and connect the selected word line 80 to ground. That is, the column decoder/bit line driver 10123 may be configured to select or deselect one or more memory strings 60 according to the Y-path control signal from the peripheral control circuit 10124. The page buffer/sense amplifier 10121 may be configured to read data from and program (write) data to the memory block 10111 according to Y path control signal from the peripheral control circuit 10124. For example, the page buffer/sense amplifier 10121 may store a page of data to be programmed into a memory page. In another example, the page buffer/sense amplifier 10121 may perform a verification operation to ensure that data has been correctly programmed into each of memory cells 601. In yet another example, during a read operation, the page buffer/sense amplifier 10121 may sense the current flowing through the bit line 80 reflecting the logic state (i.e. data) of the memory cell 601 and amplify small signal to a measurable magnification.

The input/output buffer 91 may transfer I/O data from/to the page buffer/sense amplifier 10121, and transfer an address ADDR or a command CMD to the peripheral control circuit 10124. In some examples, the input/output buffer 91 may be used as an interface between the controller 102 and the memory 101.

The peripheral control circuit 10124 may control the page buffer/sense amplifier 10121 and the row decoder/word line driver 10122 in response to the command CMD passed by the input/output buffer 91. The peripheral control circuit 10124 may control the row decoder/word line driver 10122 and the page buffer/sense amplifier 10121 to program the selected memory cell 601 during the programming operation. The peripheral control circuit 10124 may control the row decoder/word line driver 10122 and the page buffer/sense amplifier 10121 to read the selected memory cell 601 during the read operation. The X-path control signal includes a row address X-ADDR, and Y path control signal includes a column address Y-ADDR, which may be used to locate the selected memory cells 601 in memory block 10111. The row address X-ADDR may include a page index, a block index and a plane index to identify a memory page, memory block 10111 and a memory plane 1011 respectively. The column address Y-ADDR may identify bytes or words in the data of the memory page.

The peripheral control circuit 10124 may include one or more control logic units in some examples. Each of control logic units described herein may include a software module and/or firmware module running on a processor, such as a micro controller unit (MCU) as part of the peripheral control circuit 10124, or a hardware module of a finite-state machine (FSM), such as an integrated circuit (IC), for example, an application-specific IC (ASIC), field-programmable gate array (FPGA) or the like, or a combination of software modules, firmware modules and hardware modules.

The voltage generator 90 may generate voltages supplied to word line 81 and bit line 80 under the control of control circuit 10124. The voltages generated by the voltage generator 90 include the read voltage Vread, the program voltage Vpgm, the pass voltage Vpass, the inhibit voltage Vinhibit and the like.

In some examples, the memory 101 may be formed based on floating gate technology. In some examples, the memory 101 may be formed based on charge trapping techniques. The charge trapping based memory 101 may provide high storage density and high intrinsic reliability. The storage data or logic state (e.g., the threshold voltage Vth of the memory cell 601) depends on the amount of charge trapped in the storage layer. In some examples, the memory 101 may include a three-dimensional (3D) memory device, where the memory cells 601 may be vertically stacked on top of each other.

In some examples, when an erase operation is performed, all trapped electronic charges in the memory layer of the memory cell 601 may be removed by applying a negative voltage difference between the 601 gate and the source terminal (e.g. ACS82), so that all the memory cells 601 in the same memory block 10111 may be reset to the erase state ER as the logic "1". The voltage difference may be induced, for example, by setting the control gate in the memory cell 601 to ground and applying a positive voltage to the source line 82. In this example, a voltage pulse may be applied to the memory cell 601 during an erase operation.

Figure 6:
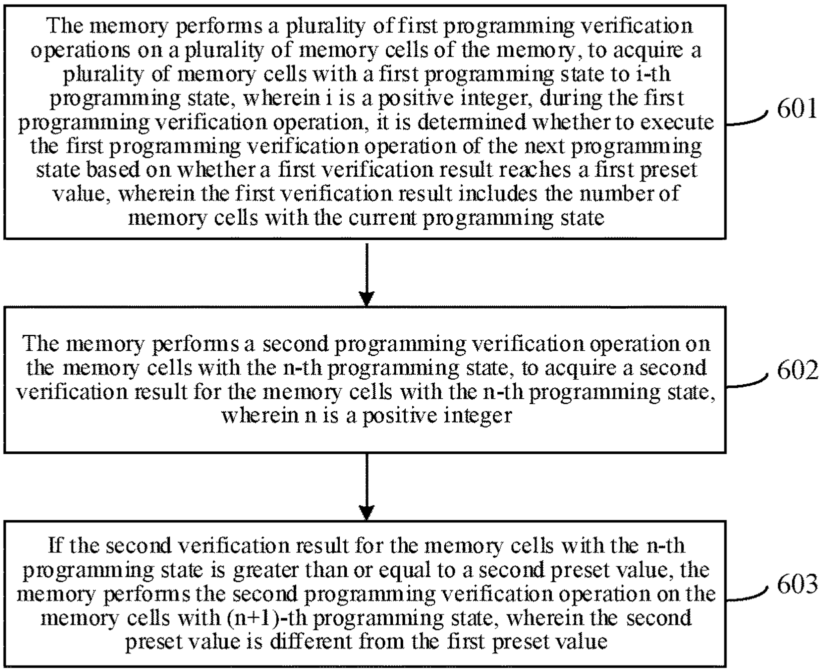
FIG. 6 is a flowchart of a method of operating a memory provided by an example of the present disclosure.

Applied to the memory described above, a method of operating a memory is provided according to an implementation, as shown in FIG. 6, which is a flowchart of the method of operating a memory provided by the examples of the present disclosure. The method of operating a memory includes the following actions.

S601. The memory performs a plurality of first programming verification operations on a plurality of memory cells of the memory, to acquire a plurality of memory cells with a first programming state to i-th programming state, wherein i is a positive integer, during the first programming verification operation, it is determined whether to execute the first programming verification operation of the next programming state based on whether a first verification result reaches a first preset value, wherein the first verification result includes the number of memory cells with the current programming state.

As an example, the memory may include a memory array composed of a plurality of memory cells. The memory cells may include single level cell, multi level cell, triple level cell, quad level cell, or higher level cell, and so on.

The method of operating a memory according to examples of this disclosure adopts two-step programming mode. Taking QLC NAND as an example, the number of programming states of the memory may be 15, that is, i=15. That is, in the coarse programming, a plurality of first programming verification operations are performed on multiple memory cells of the memory, to acquire a plurality of memory cells with the first programming state to the fifteenth programming state. The memory cells with the first programming state to the fifteenth programming state are widely distributed memory cells.

The first verification result includes the number of memory cells with the current programming state. In addition, the first verification result may also include the first type of indication information indicating whether each of verified memory cells has passed the programming, and the second type of indication information indicating whether each of verified memory cells has failed the programming.

The step size for the plurality of programming pulses in the first programming verification operation is larger than the step size for the plurality of programming pulses in the second programming verification operation. Thus, the first programming verification operation may be considered as a coarse programming, and the second programming verification operation may be considered as a fine programming. Both the coarse programming and the fine programming may adopt incremental step pulse programming (ISPP), and the step size for the coarse programming is larger than the step size for the fine programming. The memory performs coarse programming first to quickly reach different programming states to increase the programming speed, and then performs fine programming to obtain better programming quality to shorten the programming time.

The first programming verification operation may include a first programming operation and a first verification operation. The first programming operation may be considered as applying a first programming pulse to a memory cell, and the first verification operation may be considered as applying a first verification voltage to a memory cell. The number of the memory cells with the current programming state may be obtained based on the first verification voltage of the current programming state.

S602. The memory performs a second programming verification operation on the memory cells with the n-th programming state, to acquire a second verification result for the memory cells with the n-th programming state, wherein n is a positive integer. Specific, n is a positive integer that smaller than i.

As an example, the second programming verification operation may include a second programming operation and a second verification operation. The second programming operation may be considered as applying a second programming pulse to the memory cells, and the second verification operation may be considered as applying a second verification voltage to the memory cells. The number of the memory cells with the current programming state may be obtained based on the second verification voltage of the current programming state.

Specifically, the memory applies a second programming pulse to the memory cells with the n-th programming state, to acquire the second verification result for the memory cells with the n-th programming state based on the second verification voltage of the n-th programming state. The second verification result is the number of successful bits for programming of the n-th programming state. In addition, the second verification result may also include a first type of indication information indicating whether each of verified memory cells has passed the programming and a second type of indication information indicating whether each of verified memory cells has failed the programming.

S603. If the second verification result for the memory cells with the n-th programming state is greater than or equal to a second preset value, the memory performs the second programming verification operation on the memory cells with (n+1)-th programming state, wherein the second preset value is different from the first preset value.

As an example, when the second verification result is greater than or equal to a second preset value, it indicates that many memory cells have reached the n-th programming state. Then it may be predicted that some memory cells with the target programming state being the (n+1)-th programming state may reach the (n+1)-th programming state after applying the next programming pulse. Therefore, a second programming verification operation should be performed for the (n+1)-th programming state after applying the next programming pulse. So, over-programming may be reduced and programming quality may be improved.

As an example, comparing with the solution that the coarse programming and fine programming both adopt the same preset value, the first preset value and the second preset value are different in the method of operating a memory according to examples of this disclosure. Thus, the effect caused by the number of passing memory cells after coarse programming is completed may be eliminated in fine programming, so as to reduce the number of verifications of fine programming.

Optionally, the method of operating a memory further includes: the memory performs a second programming verification operation on the memory cells with the n-th programming state if the second verification result for the memory cells with the n-th programming state is less than the second preset value.

As an example, when the second verification result is less than a second preset value, it indicates that no memory cells or only a small number of memory cells have reached the n-th programming state. Then it may be predicted that almost no memory cells with target programming state being the (n+1)-th programming state will reach the (n+1)-th programming state after applying the next programming pulse. That is, the (n+1)-th programming state will not be successfully programmed. Therefore, there is no need to perform a second programming verification operation on the (n+1)-th programming state after applying the next encoding pulse. In such a way, the number of programming states that are to be verified in the next second programming verification operation is reduced, which is beneficial to shorten the time of performing programming verifications and reduce the number of the verification results to be processed, and improve the programming efficiency.

In another implementation, the second verification result may also be the number of failed bits for programming of the n-th programming state. If the second verification result is less than the third preset value, it is determined to perform the second programming verification operation on the memory cells with the (n+1)-th programming state. If the second verification result is greater than or equal to the third preset value, it is determined to perform the second programming verification operation on the memory cells with n-th programming state.

As an example, the binary encoding may be used to indicate whether a memory cell passes the programming or not. For example, 0 may indicate pass the programming, and 1 may indicate fail the programming, or vice versa. In practice, the skilled in the art may select a suitable way to indicate whether the memory cell pass the programming or not according to the actual situation, which is not limited by examples of the present disclosure.

It is understood that programming in the n-th programming state is considered to be successful when the number of failed bits of programming in the n-th programming state is less than a third preset value. Therefore, there is no need to perform programming verification on the n-th programming state in the next second programming verification operation. In such a way, it may shorten the time of performing programming verifications compared with verifying the n-th programming state every time. When the number of failed bits for programming in the n-th programming state is greater than or equal to the third preset value, it may be considered that the programming in the n-th programming state have not been successful. Therefore, it is necessary to proceed the programming verification of the n-th programming state in the next second programming verification operation.

Optionally, before step S602, the method of operating a memory further comprises: the memory obtains a pre-verification result for the memory cells with the n-th programming state based on a verification voltage of the second programming verification operation.

As an example, pre-verification results are obtained after completion of the coarse programming and before the start of the fine programming. The pre-verification result is the number of memory cells that have reached the n-th programming state after coarse programming is completed. The pre-verification results may be understood as the effect on fine programming caused by the coarse programming. In order to improve the accuracy of fine programming, the effect of pre-verification results should be eliminated in fine programming.

Figure 7:
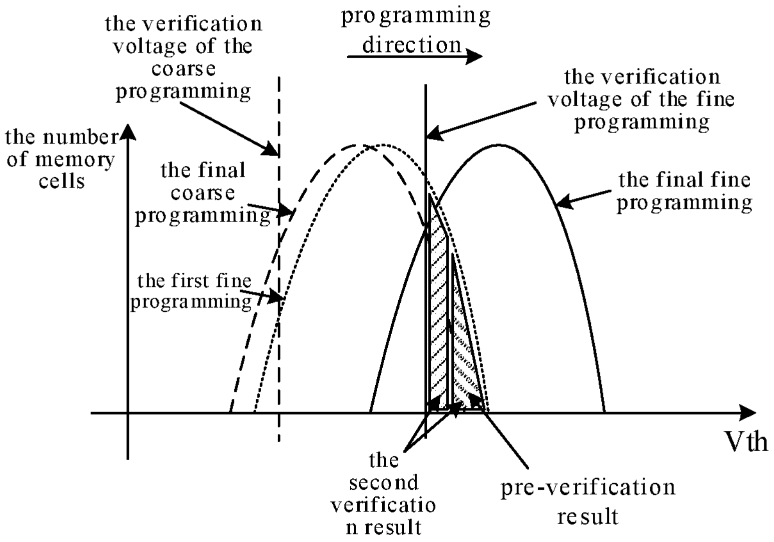
FIG. 7 is a threshold voltage distribution diagram of an n-th programming state provided by an example of the present disclosure.

Specifically, the second verification result may be obtained based on the verification voltages of fine programming after performing the first fine programming. At this time, if the second verification result includes the number of memory cells with the n-th programming state, the second preset value is larger than the first preset value. As showed in FIG. 7, FIG. 7 is a threshold voltage distribution diagram of n-th programming state provided by the examples of the present disclosure. In particularly, FIG. 7 shows the threshold voltage distribution diagram of the final coarse programming in the n-th programming state, the threshold voltage distribution diagram of the final fine programming in the n-th programming state and the threshold voltage distribution diagram of the first fine programming. The pre-verification results may be obtained based on the verification voltage of fine programming. At this time, the second verification result includes the pre-verification result, that is, the second verification result includes the number of memory cells that have completed the programming in the coarse programming. In order to reduce the risk of over-programming, the second preset value should be set to be greater than the first preset value, that is, the preset value of fine programming is greater than the preset value of coarse programming.

Figure 8:
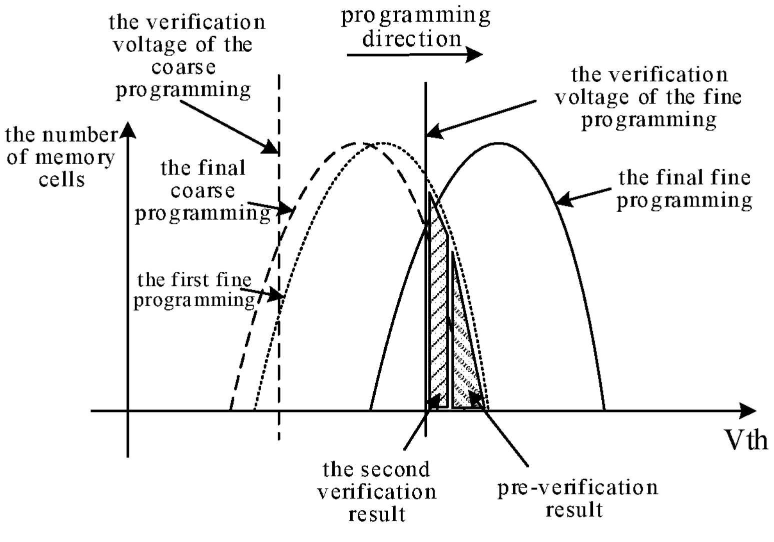
FIG. 8 is another threshold voltage distribution diagram of an n-th programming state provided by an example of the present disclosure.

In addition, if the second verification result includes the number of memory cells with the n-th programming state other than the number of memory cells corresponding to the pre-verification result, the second preset value is less than the first preset value. As showed in FIG. 8, FIG. 8 is another threshold voltage distribution diagram of n-th programming state provided by examples of the present disclosure. In particularly, FIG. 8 shows the threshold voltage distribution diagram of the final coarse programming in the n-th programming state, the threshold voltage distribution diagram of the final fine programming in the n-th programming state and the threshold voltage distribution diagram of the first fine programming. The pre-verification results may be obtained based on the verification voltage of fine programming. At this time, the second verification result includes the number of memory cells with the n-th programming state other than the number of memory cells corresponding to the pre-verification result, that is, the second verification result does not include the pre-verification result. In order to reduce the risk of over-programming, the second preset value should be set to be less than the first preset value, that is, the preset value of fine programming is less than the preset value of coarse programming.

Figure 9:
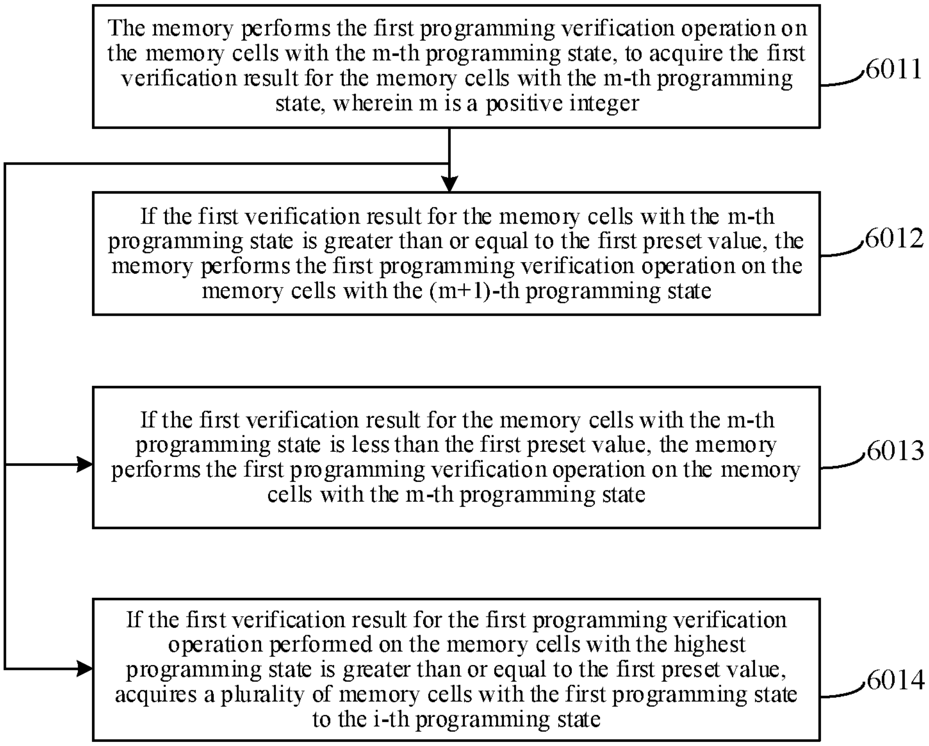
FIG. 9 is a flowchart for coarse programming of a memory provided by an example of the present disclosure.

Optionally, S601 may include S6011 to S6014, as shown in FIG. 9, which is a flowchart for coarse programming of a memory provided in examples of the present disclosure.

S6011. The memory performs the first programming verification operation on the memory cells with the m-th programming state, to acquire the first verification result for the memory cells with the m-th programming state, wherein m is a positive integer.

As an example, the first programming verification operations may include a first programming operation, i.e. applying a programming pulse to memory cells with the m-th programming state, and a first verification operation. The first verification result may be obtained based on the first verification voltage of the first verification operation. The first verification result is the number of successful bits for programming the m-th programming state.

S6012. If the first verification result for the memory cells with the m-th programming state is greater than or equal to the first preset value, the memory performs the first programming verification operation on the memory cells with the (m+1)-th programming state.

As an example, when the first verification result is greater than or equal to the first preset value, it indicates that many memory cells have reached the m-th programming state. Then it may be predicted that memory cells with the target programming state being the (m+1)-th programming state may reach the (m+1)-th programming state after applying the next programming pulse. Therefore, it is necessary to perform the first programming verification operation on the (m+1)-th programming state after applying the next programming pulse. So, over-programming may be reduced and programming quality may be improved.

S6013. If the first verification result for the memory cells with the m-th programming state is less than the first preset value, the memory performs the first programming verification operation on the memory cells with the m-th programming state.

As an example, when the first verification result is less than a second preset value, it indicates that no memory cells or only a few of memory cells have reached the m-th programming state. Then it may be predicted that almost no memory cells with target programming state being the (m+1)-th programming state will reach the (m+1)-th programming state after applying the next programming pulse, i.e. the (m+1)-th programming state will not be successfully programmed. Therefore, there is no need to perform the first programming verification operation on the (m+1)-th programming state after applying the next encoding pulse. Thus, the number of programming states to be verified in the next first programming verification operation may be reduced, which is beneficial to shorten the time of performing programming verifications and the number of verifications results to be processed, thus to improve the programming efficiency.

In another implementation, the first verification result may also be the number of failed bits for programming the m-th programming state. If the first verification result is less than the fourth preset value, it is determined to perform the first programming verification operation on the memory cells with the (m+1)-th programming state. If the first verification result is greater than or equal to the fourth preset value, it is determined to perform the first programming verification operation on memory cells with the m-th programming state.

It is understood that the programming of the m-th programming state is considered to be successful when the number of failed bits for programming the m-th programming state is less than a fourth preset value. Thus, there is no need to perform the programming verification operation on the m-th programming state in the next first programming verification operation. Therefore, compared with verifying the m-th programming state every time, the time of performing programming verifications may be shortened and the programming speed may be improved. When the number of failed bits for programming the m-th programming state is greater than or equal to the fourth preset value, the programming of the m-th programming state is not considered to be successful. Therefore, it is necessary to proceed the programming verification operation on the m-th programming state in the next first programming verification operation.

S6014. If the first verification result for the first programming verification operation performed on the memory cells with the highest programming state is greater than or equal to the first preset value, acquires a plurality of memory cells with the first programming state to the i-th programming state.

As an example, if the first verification result includes the number of memory cells that have reached the highest programming state, i.e., the first verification result is greater than or equal to the first preset value, it indicates that there are many memory cells have reached the highest programming state, i.e., the coarse programming is completed.

Optionally, the method of operating a memory further includes that the memory obtains a first number of the first programming verification operations, and determines the first preset value according to the first number. The memory obtains a second number of the second programming verification operations, and determines the second preset value according to the second number.

As an example, the first and second number are both understood as the time of cycles. It is referred to as a cycle that an erase operation and a write operation on the memory are performed. The programming performance of the memory may change with the time of cycles increases, resulting in a change in the programming speed. It may be understood that cycles are defined in the smallest unit of programming. For example, when encoding in a block as the smallest unit, the time of cycles of each of memory cells in the block is substantially the same. In addition, when the memory is programmed in different minimum unit, the time of cycles obtained is the the time of cycles of the minimum cell for which the programming is performed.

Compared to the fixed first and second preset values, in the examples of the present disclosure, the preset value is determined by obtaining number of the programming verification operations and based on the obtained number. Thus, the programming characteristics changed with the number of cycles may be tracked in the programming verification operation, the range of the preset value may be adjusted flexibly to reduce the situation in which the programming speed is slow due to the improper preset values, thus to improve the programming speed and ensure the programming quality.

An electronic device is also provided in the examples of this disclosure. The electronic device may be any one of a mobile phone, a desktop computer, a tablet, a notebook computer, a server, a vehicle-mounted device, a wearable device (e.g., a smart watch, a smart bracelet, smart glasses, etc.), a mobile power supply, a game console, a digital multimedia player, etc.

The electronic device may include the memory system described above and may also include at least one of a central processing unit (CPU) and a cache, and the like.

Examples of the present disclosure provide a method of operating a memory, a memory and a memory system intended to solve the problem of how to shorten programming time.

In order to achieve the above object, the example of the present disclosure adopts the following technical schemes.

In one aspect, a method of operating a memory is provided, the method comprising: performing a plurality of first programming verification operations on a plurality of memory cells of the memory, to acquire a plurality of memory cells with a first programming state to an i-th programming state, wherein i is a positive integer, during the first programming verification operation, it is determined whether to execute the first programming verification operation of the next programming state based on whether a first verification result reaches a first preset value, wherein the first verification result includes the number of memory cells with the current programming state; performing a second programming verification operation on the memory cells with an n-th programming state, to acquire a second verification result for the memory cells with the n-th programming state, wherein n is a positive integer; if the second verification result for the memory cells with the n-th programming state is greater than or equal to a second preset value, performing the second programming verification operation on the memory cells with an (n+1)-th programming state, wherein the second preset value is different from the first preset value.

The method of operating a memory provided by the above examples of the present disclosure employs two-steps programming including coarse programming and fine programming. In the coarse programming, it is determined whether to perform a first programming verification operation of a next programming state based on a first preset value, and in the fine programming, it is determined whether to perform a second programming verification operation of a next programming state based on a second preset value. Comparing with the solution in which a same preset value is used in both coarse programming and fine programming, the method of operating a memory of this disclosure uses different preset values in coarse programming and fine programming, thus the effect on fine programming caused by the coarse programming may be reduced, so that the number of the verification operations of the fine programming is reduced and the time for programming is shortened.

In some examples, before performing a second programming verification operation on the memory cells with the n-th programming state to acquire a second verification result for the memory cells with the n-th programming state, the method further comprises: obtaining a pre-verification result for the memory cells with the n-th programming state based on a verification voltage of the second programming verification operation.

In these examples, the pre-verification result is the number of memory cells that have reached the n-th programming state after the coarse programming is completed. The pre-verification result may be understood as the effect on fine programming caused by the coarse programming. Based on the pre-verification result, the second preset value in the fine programming may be adjusted, so that the number of the verification operations of the fine programming is reduced and the time for programming is shortened.

In some examples, the second verification result includes the number of the memory cells with the n-th programming state, and the second preset value is larger than the first preset value.

In these examples, if the second verification result includes the number of memory cells with the n-th programming state, equivalently, the second verification result includes the effect on fine programming caused by the coarse programming. At this time, the second preset value is greater than the first preset value, the effect on fine programming caused by the coarse programming may be reduced, so that the number of the verification operations of the fine programming is reduced and the time for programming is shortened.

In some examples, the second verification result includes the number of memory cells with the n-th programming state other than the number of memory cells corresponding to the pre-verification result, and the second preset value is smaller than the first preset value.

In these examples, if the second verification result does not include the number of memory cells with the n-th programming state, equivalently, the second verification result shows the effect on fine programming caused by the coarse programming. At this time, the second preset value is less than the first preset value, the effect on fine programming caused by the coarse programming may be reduced, so that the number of the verification operations of the fine programming is reduced and the time for programming is shortened.

In some examples, performing a plurality of first programming verification operations on a plurality of memory cells of the memory to acquire a plurality of memory cells with a first programming state to an i-th programming state comprises: performing the first programming verification operation on the memory cells with the m-th programming state, to acquire the first verification result for the memory cells with the m-th programming state, wherein m is a positive integer; if the first verification result for the memory cells with the m-th programming state is greater than or equal to the first preset value, performing the first programming verification operation on the memory cells with the (m+1)-th programming state; if the first verification result for the memory cells with the m-th programming state is less than the first preset value, performing the first programming verification operation on the memory cells with the m-th programming state; if the first verification result for the first programming verification operation performed on the memory cells with the highest programming state is greater than or equal to the first preset value, acquiring a plurality of memory cells with the first programming state to the i-th programming state.

In some examples, it is determined whether to proceed the first programming verification operation of the current programming state or to perform the first programming verification operation of the next programming state according to the comparison of the first verification result for the memory cells with the m-th programming state and the first preset value, which may dynamically determine the starting time of each of programming states to be verified. Therefore, the accuracy of the determined staring time of each of programming states to be verified is improved, and the number of verifications may be reduced and the time for programming is shortened.

In some examples, a step size for a plurality of programming pulses in the first programming verification operation is greater than a step size for a plurality of programming pulses in the second programming verification operation.

In some examples, a plurality of first programming verification operations may be considered as coarse programming, and a plurality of second programming verification operations may be considered as fine programming. The method of operating a memory provided by the examples of present application uses the coarse programming firstly to quickly reach different programming states to improve the programming speed, and then uses fine programming to acquire better programming quality and shorten the time for programming.

In some examples, if the second verification result for the memory cells with the n-th programming state is less than the second preset value, performing the second programming verification operation on the memory cells with the n-th programming state.

In these examples, if the second verification result is less than the second preset value, it is indicated that only a small number of memory cells have reached the n-th programming state, it may be predicted that almost no memory cells with target programming state being the (n+1)-th programming state may reach the (n+1)-th programming state after the next programming pulse is applied. At this time, there is no need to perform the second programming verification operation on the memory cells with the (n+1)-th programming state. So, the number of the second programming verification operations may be reduced, and the time for programming is facilitated to be shortened, while the number of the second verification results to be processed is reduced and the programming efficiency is improved.

In some examples, the method further comprises: obtaining a first number of the first programming verification operations, and determining the first preset value according to the first number; obtaining a second number of the second programming verification operations, and determining the second preset value according to the second number.

In these examples, the programming characteristics changed with the number of cycles may be tracked during the programming verification operation by way of obtaining the number of the programming verification operations and determining the preset value according to the number. The range of the preset value may be adjusted flexibly to reduce the situation in which the programming speed is slow due to the preset values being determined improperly, thus to facilitate improving the programming speed and ensure the programming quality.

In the second aspect, a memory is provided, which comprises: a memory cell array including a plurality of memory cells; a peripheral circuit coupled to the memory cell array and is configured to: perform a plurality of first programming verification operations on a plurality of memory cells of the memory, to acquire a plurality of memory cells with a first programming state to an i-th programming state, wherein i is a positive integer, during the first programming verification operation, it is determined whether to execute the first programming verification operation of the next programming state based on whether a first verification result reaches a first preset value, wherein the first verification result includes the number of memory cells with the current programming state; perform a second programming verification operation on the memory cells with the n-th programming state, to acquire a second verification result for the memory cells with the n-th programming state, wherein n is a positive integer; if the second verification result for the memory cells with the n-th programming state is greater than or equal to a second preset value, performing the second programming verification operation on the memory cells with the (n+1)-th programming state, wherein the second preset value is different from the first preset value.

The beneficial effects of the second aspect may be referred to the description of the first aspect.

In some examples, the peripheral circuit is further configured to: obtain a pre-verification result for the memory cells with the n-th programming state based on a verification voltage of the second programming verification operation.

In some examples, the second verification result includes the number of the memory cells with the n-th programming state, and the second preset value is larger than the first preset value.

In some examples, the second verification result includes the number of memory cells with the n-th programming state other than the number of memory cells corresponding to the pre-verification result, and the second preset value is smaller than the first preset value.

In some examples, the peripheral circuit is further configured to: perform the first programming verification operation on the memory cells with the m-th programming state, to acquire the first verification result for the memory cells with the m-th programming state, wherein m is a positive integer; if the first verification result for the memory cells with the m-th programming state is greater than or equal to the first preset value, perform the first programming verification operation on the memory cells with the (m+1)-th programming state; if the first verification result for the memory cells with the m-th programming state is less than the first preset value, perform the first programming verification operation on the memory cells with the m-th programming state; if the first verification result for the first programming verification operation performed on the memory cells with the highest programming state is greater than or equal to the first preset value, acquiring a plurality of memory cells with the first programming state to the i-th programming state.

In some examples, a step size for a plurality of programming pulses in the first programming verification operation is greater than a step size for a plurality of programming pulses in the second programming verification operation.

In some examples, the peripheral circuit is further configured to: if the second verification result for the memory cells with the n-th programming state is less than the second preset value, perform the second programming verification operation on the memory cells with the n-th programming state.

In some examples, the peripheral circuit is further configured to: obtain a first number of the first programming verification operations, and determine the first preset value according to the first number; obtain a second number of the second programming verification operations, and determine the second preset value according to the second number.

In the third aspect, a memory system is provided, which comprises: a memory of above first or second aspect and a memory controller coupled to the memory and configured to control the memory.

It will be understood that the beneficial effects achieved by the method of operating a memory, a memory and a memory system provided by the above-mentioned examples of the present disclosure may be referred to the beneficial effects of the semiconductor structure described above, which will not be repeated herein.

The foregoing are only examples of the present disclosure, but the scope of protection of the present disclosure is not limited thereto. Any variation or permutation readily contemplated by those skilled in the art within the scope of the present disclosure should be covered within the scope of protection of the present disclosure. Therefore, the scope of protection of this disclosure shall be subject to the scope of protection of the claims.

What is claimed is:

1. A method of operating a memory, comprising:

performing a plurality of first programming verification operations on a plurality of memory cells of the memory, to identify counts of the plurality of memory cells with a first programming state to an i-th programming state, wherein i is a positive integer, during a first programming verification operation;

determining whether to execute the first programming verification operation of a next programming state based on whether a first verification result reaches a first preset value, wherein the first verification result includes a number of memory cells with a current programming state;

performing a second programming verification operation on the memory cells with an n-th programming state, to acquire a second verification result for the memory cells with the n-th programming state, wherein n is a positive integer; and if the second verification result for the memory cells with the n-th programming state is greater than or equal to a second preset value, performing the second programming verification operation on the memory cells with an (n+1)-th programming state, wherein the second preset value is selected to be greater than the first preset value.

2. The method of claim 1, wherein before the performing a second programming verification operation on the memory cells with the n-th programming state to acquire a second verification result for the memory cells with the n-th programming state, the method further comprises:

obtaining a pre-verification result for the memory cells with the n-th programming state based on a verification voltage of the second programming verification operation.

3. The method of claim 2, wherein the second verification result includes the number of the memory cells with n-th programming state, and the second preset value is larger than the first preset value.

4. The method of claim 1, wherein the performing a plurality of first programming verification operations on a plurality of memory cells of the memory to acquire a plurality of memory cells with a first programming state to the i-th programming state comprises:

performing the first programming verification operation on the memory cells with a m-th programming state, to acquire the first verification result for the memory cells with the m-th programming state, wherein m is a positive integer;

if the first verification result for the memory cells with the m-th programming state is greater than or equal to the first preset value, performing the first programming verification operation on the memory cells with an (m+1)-th programming state;

if the first verification result for the memory cells with the m-th programming state is less than the first preset value, performing the first programming verification operation on the memory cells with the m-th programming state; and if the first verification result for the first programming verification operation performed on the memory cells with the highest programming state is greater than or equal to the first preset value, acquiring the plurality of memory cells with the first programming state to the i-th programming state.

5. The method of claim 1, wherein a step size for the plurality of first programming verification operations is greater than the step size for the plurality of programming pulses in the second programming verification operation.

6. The method of claim 1, further comprising:

if the second verification result for the memory cells with the n-th programming state is less than the second preset value, performing the second programming verification operation on the memory cells with the n-th programming state.

7. The method of claim 1, further comprising:

obtaining a first number of the first programming verification operations, and determining the first preset value according to the first number; and obtaining a second number of the second programming verification operations, and determining the second preset value according to the second number.

8. A memory, comprises:

a memory cell array including a plurality of memory cells;

a peripheral circuit coupled to the memory cell array and configured to:

perform a plurality of first programming verification operations on a plurality of memory cells of the memory, to identify counts of the plurality of memory cells with a first programming state to an i-th programming state, wherein i is a positive integer, during the first programming verification operation;

determine whether to execute the first programming verification operation of a next programming state based on whether a first verification result reaches a first preset value, wherein the first verification result includes a number of memory cells with a current programming state;

perform a second programming verification operation on the memory cells with an n-th programming state, to acquire a second verification result for the memory cells with the n-th programming state, wherein n is a positive integer; and if the second verification result for the memory cells with the n-th programming state is greater than or equal to a second preset value, perform the second programming verification operation on the memory cells with an (n+1)-th programming state, wherein the second preset value is selected to be greater than the first preset value.

9. The memory of claim 8, wherein the peripheral circuit is further configured to:

obtain a pre-verification result for the memory cells with the n-th programming state based on a verification voltage of the second programming verification operation.

10. The memory of claim 9, wherein the second verification result includes the number of the memory cells with the n-th programming state, and the second preset value is larger than the first preset value.

11. The memory of claim 9, wherein the peripheral circuit is further configured to:

perform the first programming verification operation on the memory cells with a m-th programming state, to acquire the first verification result for the memory cells with the m-th programming state, wherein m is a positive integer;

if the first verification result for the memory cells with the m-th programming state is greater than or equal to the first preset value, perform the first programming verification operation on the memory cells with an (m+1)-th programming state;

if the first verification result for the memory cells with the m-th programming state is less than the first preset value, perform the first programming verification operation on the memory cells with the m-th programming state; and if the first verification result for the first programming verification operation performed on the memory cells with the highest programming state is greater than or equal to the first preset value, acquire the plurality of memory cells with the first programming state to the i-th programming state.

12. The memory of claim 9, wherein a step size for a plurality of programming pulses in the first programming verification operation is greater than the step size for the plurality of programming pulses in the second programming verification operation.

13. The memory of claim 9, wherein the peripheral circuit is further configured to:

if the second verification result for the memory cells with the n-th programming state is less than the second preset value, perform the second programming verification operation on the memory cells with the n-th programming state.

14. The memory of claim 9, wherein the peripheral circuit is further configured to:

obtain a first number of the first programming verification operations, and determine the first preset value according to the first number; and obtain a second number of the second programming verification operations, and determine the second preset value according to the second number.

15. A memory system, comprising:

one or more memories, comprising:

a memory cell array including a plurality of memory cells;

a peripheral circuit coupled to the memory cell array and is configured to:

perform a plurality of first programming verification operations on a plurality of memory cells of the memory, to identify counts of a plurality of memory cells with a first programming state to an i-th programming state, wherein i is a positive integer, during the first programming verification operation;

determine whether to execute the first programming verification operation of a next programming state based on whether a first verification result reaches a first preset value, wherein the first verification result includes a number of memory cells with a current programming state;

perform a second programming verification operation on the memory cells with an n-th programming state, to acquire a second verification result for the memory cells with the n-th programming state, wherein n is a positive integer; and if the second verification result for the memory cells with the n-th programming state is greater than or equal to a second preset value, perform the second programming verification operation on the memory cells with an (n+1)-th programming state, wherein the second preset value is selected to be greater than the first preset value; and a memory controller coupled to the memory and configured to control the memory.

16. The memory of claim 15, wherein the peripheral circuit is further configured to:

obtain a pre-verification result for the memory cells with the n-th programming state based on a verification voltage of the second programming verification operation.

17. The memory of claim 15, wherein the second verification result includes the number of the memory cells with the n-th programming state, and the second preset value is larger than the first preset value.

* * * * *